United States Patent [19]

Towne et al.

[11] 4,072,379

[45] Feb. 7, 1978

[54] ELECTRIC POWER DISTRIBUTING APPARATUS

[75] Inventors: Gary L. Towne; Noel F. Depew; Charles A. Fowler, all of Wichita, Kans.

[73] Assignee: NCR Corporation, Dayton, Ohio

[21] Appl. No.: 750,334

[22] Filed: Dec. 13, 1976

[51] Int. Cl.[2] .............................................. H05K 1/07

[52] U.S. Cl. ............................ 339/17 LM; 339/21 R; 339/74 R; 339/99 R

[58] Field of Search ............. 339/21 R, 22 B, 17 LM, 339/17 M, 74, 99 R

[56] References Cited

U.S. PATENT DOCUMENTS

| | | | |
|---|---|---|---|
| 2,444,648 | 7/1948 | Jackson | 339/22 B |
| 3,015,795 | 1/1962 | Meacham | 339/22 B |
| 3,434,093 | 3/1969 | Wedekind | 339/99 R |
| 3,609,463 | 9/1971 | Laboue | 339/17 LM |
| 3,611,259 | 10/1971 | Palecek | 339/74 R |
| 3,977,747 | 8/1976 | Broutros | 339/74 R |

FOREIGN PATENT DOCUMENTS

| | | | |
|---|---|---|---|
| 926,960 | 5/1973 | Canada | 339/17 LM |

*Primary Examiner*—Joseph H. McGlynn
*Assistant Examiner*—Mark S. Bicks
*Attorney, Agent, or Firm*—J. T. Cavender; Albert L. Sessler, Jr.; Elmer Wargo

[57] ABSTRACT

The apparatus includes a housing having electrical bus conductors therein and a plug-in module for providing an electrical connection between selected ones of the bus conductors and a circuit board having electrical contacts thereon. The module has an opening therein to receive the circuit board and the module is detachably secured to the housing. The module has leaf-type conductors therein forming the connection between the selected bus conductors and the electrical contacts on the circuit board inserted therein. A camming lever is included in the module to expand the leaf-type conductors to permit removal of the circuit board and side insertion of the circuit board, which camming lever also locks the circuit board to the module to prevent its removal except when the leaf-type conductors are expanded.

5 Claims, 7 Drawing Figures

ELECTRIC POWER DISTRIBUTING APPARATUS

BACKGROUND OF THE INVENTION

This invention relates to an electric power distributing apparatus and more particularly it relates to an apparatus for distributing electric power between a power source and electrical circuit boards.

Some of the problems related to prior art apparatuses for distributing electric power to a plurality of electrical circuit members or boards, like printed circuit boards, are that they are generally not too flexible, require soldering to effect electrical connection, require a relatively high level of labor skill for fabrication and installation, and are generally expensive to fabricate.

Another problem is that certain "testing for approval" agencies like Underwriter's Laboratories require that a full rated current be delivered to particular printed circuit boards in certain electronic equipment. In some prior art distribution systems, a fuse is generally positioned between the power source and the printed circuit board. Because some voltage drop does occur in the fuse itself, it is difficult to maintain the full current rating at the printed circuit board itself. Under the present invention, heavy or large diameter wires are used in a common bus arrangement, and these heavy bus wires are directly connected to the power source. Special conductor means located in a plug-in module engage the heavy bus wires to provide for a solderless connection therebetween, and the special conductor means also provide an electrical connection to a printed circuit board which is inserted and retained in the plug-in module. Usually, at least one printed circuit wire on the printed circuit board can act as a fuse.

Some prior art power distribution apparatuses are shown in the following U.S. Patents:

Nos. 2,960,674 and 3,044,036.

SUMMARY OF THE INVENTION

This invention relates to an electric power distributing apparatus comprising a housing having bus conductors therein and a plug-in module for providing an electrical connection between selected ones of the bus conductors and a circuit board like a printed circuit board having electrical contacts thereon. There is provided, also, a means for detachably securing the module to the housing, and the module has an opening therein to receive the circuit board. The plug-in module also includes conductor means having first and second ends, with the first ends forming an electrical connection with selected ones of the bus conductors and the second ends forming an electrical connection with the contacts on a printed circuit board which is inserted and retained in the plug-in module.

The present invention obviates many of the problems mentioned earlier herein, and is also especially suited for situations in which a printed circuit board must be inserted from a side into an electrical connector as contrasted with the usual straight-in insertion.

These advantages along with others will be more readily apparent from the following description, drawings, and claims, wherein similar parts are referenced by similar numerals.

DETAILED DESCRIPTION OF THE INVENTION

Figure 1:
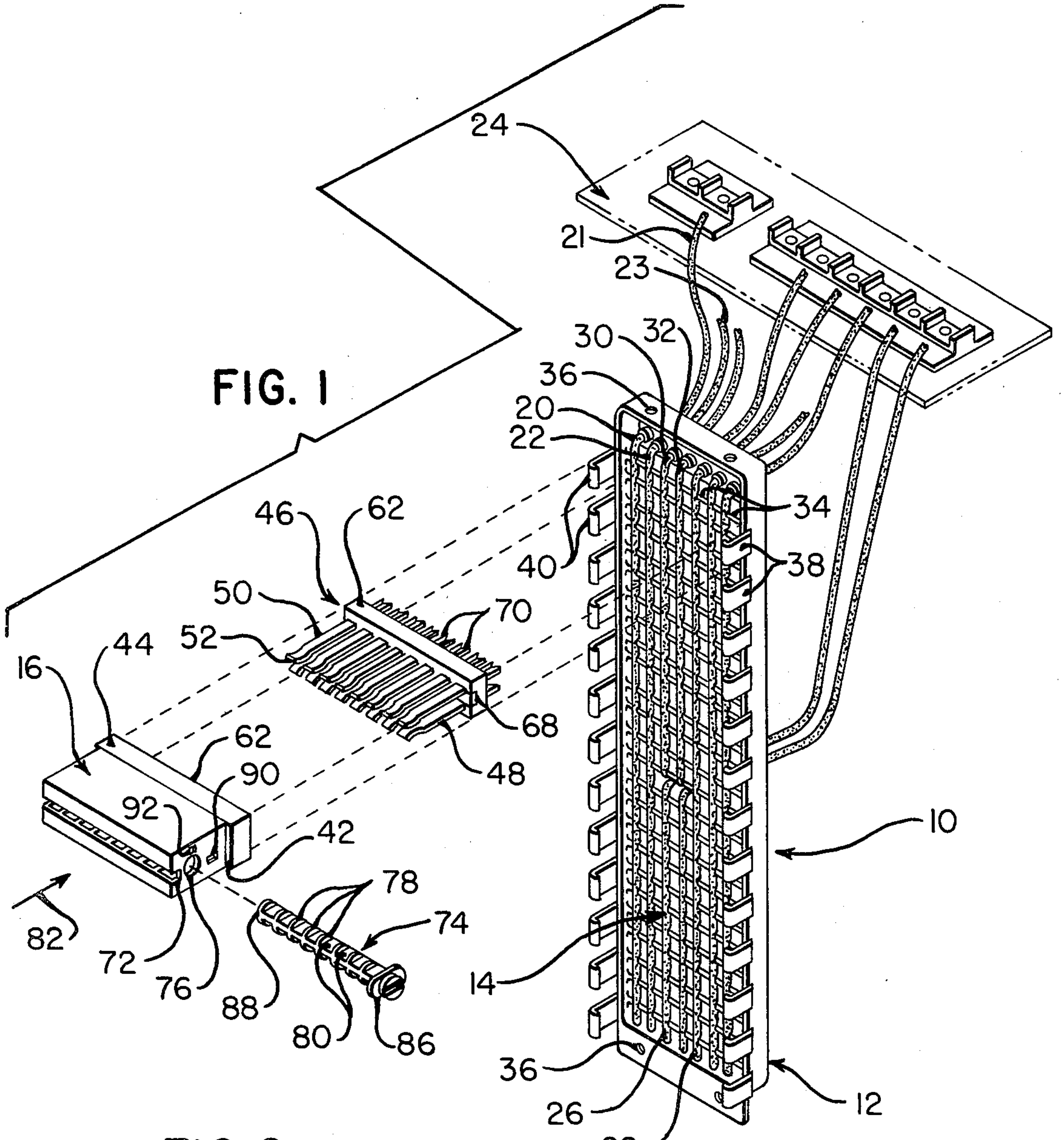
FIG. 1 is a general, exploded view in perspective of the apparatus of this invention showing a power source, a housing having therein a plurality of bus conductors which are directly connected to the power source, and a plug-in module which forms the connection between selected ones of the bus conductors and a circuit board.

FIG. 1 is a general, exploded view, in perspective, of the apparatus of this invention which is designated generally as 10 and includes a housing 12 having a plurality 14 of bus conductors therein, and a plug-in module 16 which is detachably secured to the housing 12. The plug-in module 16 (hereinafter called module) provides the electrical connection between the plurality 14 of bus conductors and electrical contacts 18 on a circuit board 20 (shown in FIG. 2) which circuit board may typically be a printed circuit board.

The housing 12 may typically be made by conventional molding techniques of plastic materials such as Lexan or Norel which are trademarks for poly-carbonate and phenyleneoxide, respectively, and which are manufactured by the General Electric Company. The housing 12 has a plurality of recesses formed therein to receive the individual bus conductors like 20, 22 of the plurality 14 of bus conductors to enable them to be positioned in spaced, parallel relationship with one another within the housing 12.

A feature of this invention is that the individual bus conductors like 20, 22 are made of electrically conductive material having a large cross-sectional area, and these same bus conductors like 20, 22 have portions like 21, 23 which extend through the housing 12 and can be directly connected to a source of power shown as a terminal block 24 having a plurality of voltage levels and ground connection terminals thereon. For example, in the embodiment shown in FIG. 1, the bus conductors like 20, 22 may be made of AWG #10 solid copper wire which may be terminated at the terminal block 24 by conventional crimp-type ring connectors (not shown). Naturally, the size of bus conductors like 20, 22 is determined by the particular application for which the apparatus 10 is designed. Note that while bus conductors 20, 22 extend along the entire length of the housing 12, bus conductors like 26, 28, 30, and 32 may extend only part way along the length of the housing 12. This type of construction provides for different combinations of voltage levels for a plurality of modules 16, depending upon where along the length of the housing 12 they are attached. Naturally, the lengths of the conductors 20, 22, 26, 28, etc., can be varied from those shown to obtain the desired combination of voltage levels for a particular application. The housing 12 also has ridges 34 (extending horizontally as viewed in FIG. 1) to help support the plug-in module 16 when it is detachably secured to the housing 12 as will be described hereinafter. A groove or recess is formed between adjacent horizontal rows of ridges 34 so as to provide for a sufficient clearance to enable conductor means associated with the module 16 to engage the peripheries of the associated bus conductors 20, 22, 30 etc. as will be described in detail hereinafter. The housing 12 has sufficient mounting holes 36 for conventionally mounting it in a fixed location. The housing 12 also has resilient, snap-type flanges 38, 40 extending from opposed sides thereof to cooperate with shoulders 42, 44 respectively on opposed sides of the module 16 to thereby provide a means for detachably securing the module 16 to the housing 12 at various points along the length thereof.

Figure 2:
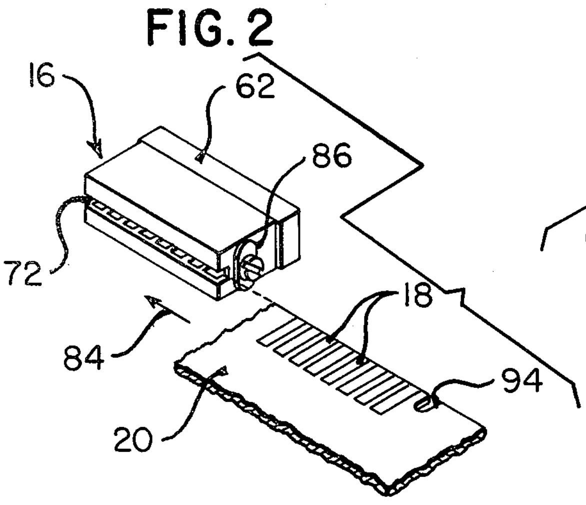
FIG. 2 is a general perspective view of a portion of the plug-in module showing side insertion of a printed circuit board.
Figure 3:
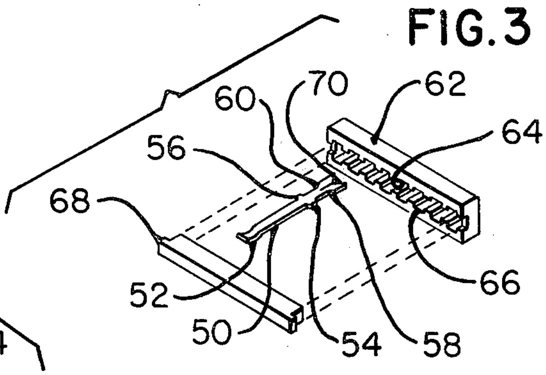
FIG. 3 is a general, exploded view, in perspective, showing additional details of conductor means located within the plug-in module.

The conductor means in the module 16, which were alluded to earlier herein, are designated generally as 46 and are best shown in FIGS. 1 and 3. Each conductor means 46 includes a lower, leaf-type conductor 48 and an upper, leaf-type conductor 50. Each conductor means 46 has a first end which engages the associated bus conductors 20, 22, 30 etc., and a second end which engages the contacts like 18 (FIG. 2) on a circuit board 20 when the circuit board is operatively positioned in the module 16 and the module is secured to the housing 12.

Figure 5:
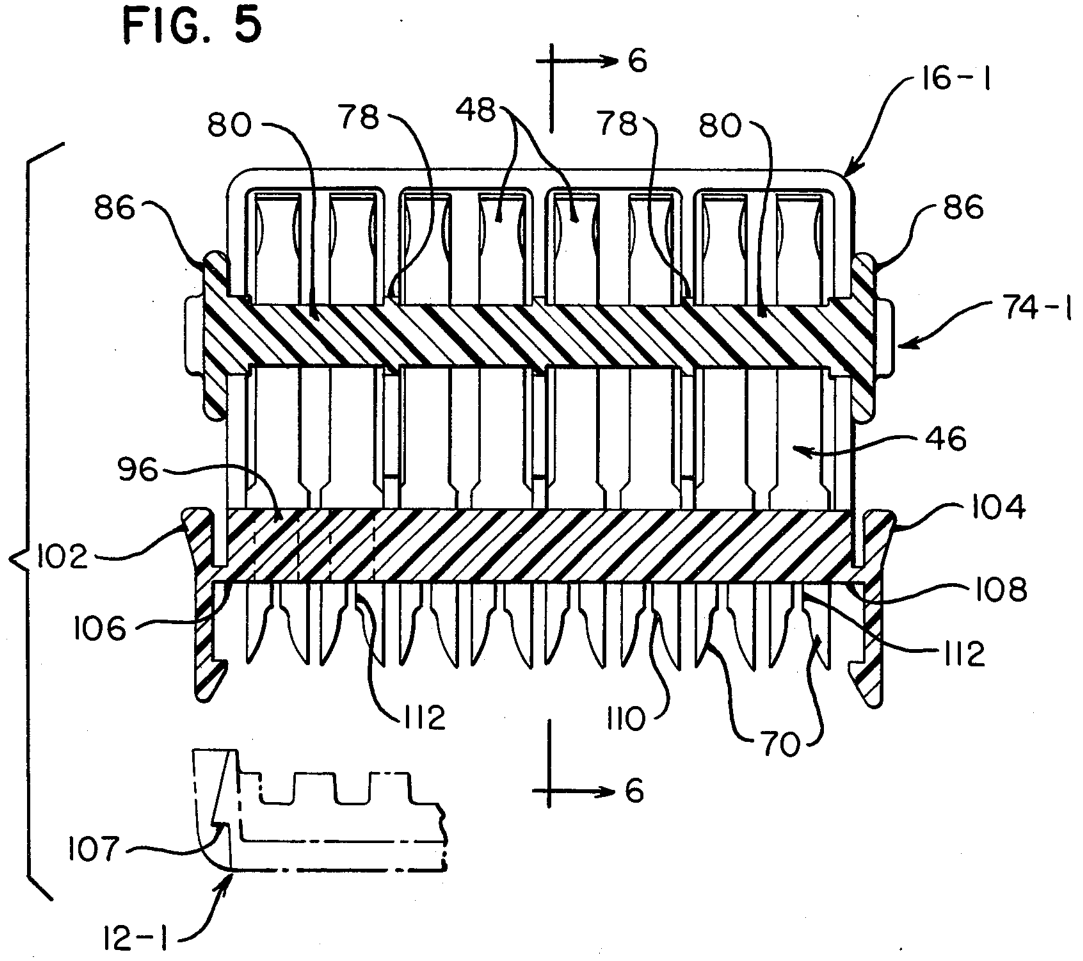
FIG. 5 is a plan view, partly in cross section, which is taken along the line 5—5 of FIG. 6 to show additional details of the plug-in module and a second means for attaching the module to the housing, with only a portion of the housing being shown therein.

Leaf-type conductor 48 is identical to leaf-type conductor 50 shown in FIG. 3, except that it is inverted from the position shown in FIG. 3 when assembled in the module 16. The leaf-type conductors 48 and 50 may be stamp-formed of a beryllium copper or phosphorus bronze or a spring tempered brass which is heat treated to provide strength for the conductors. The turned-up contact areas 52 of the leaf-type conductors 48, 50 are covered with a layer of tin, and with the heat treatment given to these conductors, a sufficient contact pressure is generated between the tin contacts 18 (FIG. 2) on the circuit board 20 and the contact areas 52 of the leaf-type conductors 48, 50 to provide for a good, solderless, electrical connection therebetween. The contacts 18 on circuit board 20 may be simple "plated through" holes to provide a common connection for the opposed sides of the circuit board 20 if desired. Each leaf-type conductor 48, 50 has projections 54, 56 on opposed sides thereof and shoulders 58, 60 on opposed sides thereof as shown in FIG. 3 to prevent axial movement of the conductor when it is installed in a block 62. The block 62 has suitable recesses 64 (FIG. 3) formed therein to receive the upper leaf-type conductors 50, and the block 62 has similar, suitable recesses 66 formed therein to receive the lower leaf-type conductors 48. A suitable spacer block 68 is positioned between the leaf-type conductors 48 and 50 and is press fitted or adhesively secured to the block 62 to maintain the leaf-type conductors 48, 50 of each conductor means 46 in the assembled relationship shown in FIG. 1. As an alternate construction, the leaf-type conductors 48, 50 may be conventionally molded into a single block of plastic material. The module 16 may be made of the plastic materials mentioned earlier herein. The ends of the leaf-type conductors 48, 50 which engage the bus conductors 20, 22, 26 etc. are shaped like end 70 of conductor 50 which is best shown in FIGS. 3 and 5. The ends 70 have a recess formed therein and are dimensioned so as to form a force fit with the associated bus conductors like 20, 22, etc. so that they cut into the surfaces of the associated bus conductors when the module 16 is attached to the housing 12; this provides for a good, solderless electrical connection.

Figure 4:
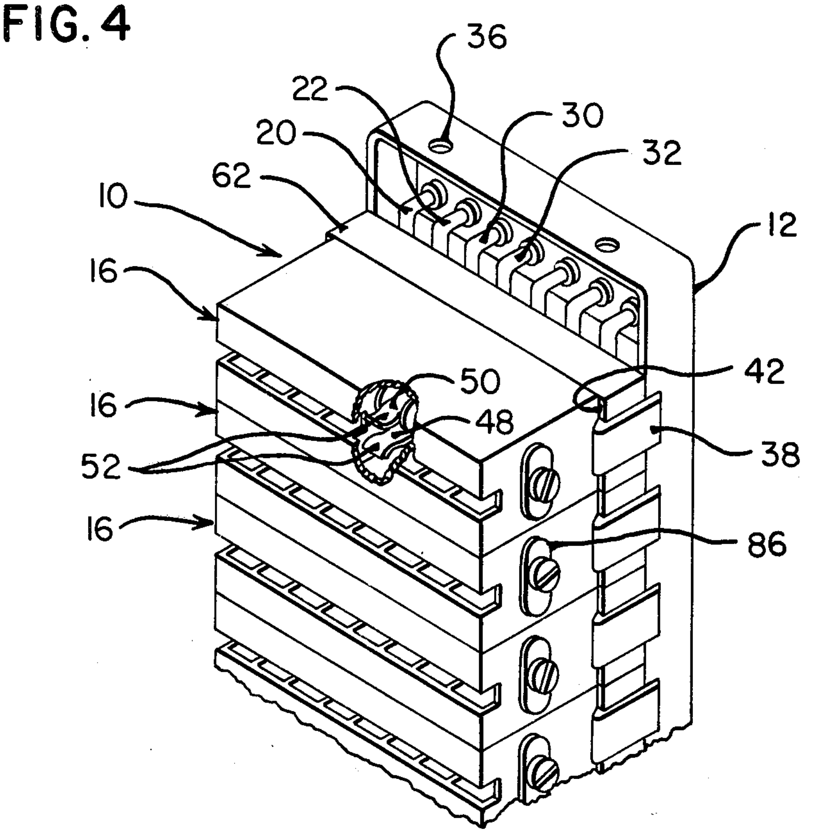
FIG. 4 is a general perspective view of a portion of the apparatus of this invention showing a plurality of plug-in modules attached to the housing.

One of the features of this invention is that it has means for facilitating the entry of a circuit board like 20 into the receiving slot 72 of the module 16 when the board is inserted therein, and that it also facilitates side insertion of a circuit board as shown in FIG. 2. The means for facilitating the entry of a circuit board includes a moving means or lever means 74 which is mounted for rotational movement in suitable holes 76 in the module 16. The lever means 74 includes a plurality of disc type guides or cams 78 which are integrally formed with interconnecting flat portions 80 as shown in FIG. 1. The flat portions 80 lie in a common plane and the disc type guides 78 are mounted perpendicularly to the flat portions 80 and are spaced apart to receive the lower and upper leaf-type conductors 48, 50 therebetween. When the lever means 74 is in the position shown in FIG. 1, the turned up contact areas 52 of the leaf-type conductors 48, 50 engage each other, and insertion of the circuit board 20 into the slot 72 from the direction of arrow 82 in FIG. 1 is difficult, but insertion of the circuit board 20 from the direction of arrow 84 in FIG. 2 is just about impossible without damaging the apparatus 10. The lever means 74 has a lever 86 integrally formed on one end thereof as shown in FIG. 1, and when this lever 86 is rotated 90 degrees in either a clockwise or a counterclockwise direction from the position shown in FIG. 1 to the position shown in FIG. 2, the flat portions 80 of the lever means 74 engage the lower and upper leaf-type conductors 48, 50 causing them to be displaced from each other (to a first position as shown in FIG. 4) to facilitate the entry of the circuit baord 20 from the direction of arrow 82 (FIG. 1), but especially from the direction of arrow 84 (FIG. 2) which is the direction for side insertion. The lever means 74 has a conventional, bulbous, slotted end 88 thereon which is compressed during insertion into the holes 76 of the module 16 and which expands after passing therethrough to restrain axial movement of the lever means 74 in one direction within the module 16, and the lever 86 restrains axial movement of the lever means 74 in the opposite direction when the lever means 74 is mounted in the module 16. Detent recesses 90 and 92, on the side of the module 16, cooperate with complementary projections (not shown) on the lever 86 to retain the lever means 74 in the two detented positions mentioned.

After the circuit board 20 is inserted in the module 16, the lever 86 may be rotated 90° in a clockwise direction from the position shown in FIG. 2 to permit the turned-up contact areas 52 of the lower and upper leaf-type conductors 48, 50 to engage the associated contacts 18 on the circuit board 20 to provide an electrical connection therebetween. As the lever 86 is rotated through the 90° mentioned, it engages a recess or slot 94 to prevent the circuit board (FIG. 2) from being pulled out of the plug-in module 16 unless the leaf-type conductors are displaced from each other. Similarly, when the lever 86 is rotated 90° from the position shown in FIG. 2, a circuit board 20 cannot be inserted in the slot 72, as the slot 72 is blocked by the lever 86.

FIG. 4 shows a plurality of modules 16 which are mounted on the housing 12 so as to obtain the desired combinations of voltage levels from the bus conductors 20, 22, 30 etc. The modules 16 have the ends 70 of the conductor means 46 extending therefrom and these ends 70 are positioned between adjacent rows of the ridges 34 of the housing 12 to assist the flanges 38, 40 in securing the modules 16 of the housing.

Figure 7:
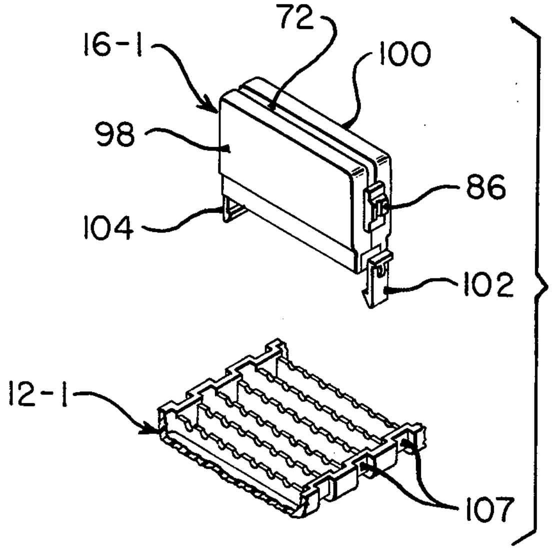
FIG. 7 is a general view, in perspective, showing how the plug-in module shown in FIGS. 5 and 6 is detachably secured to a modified housing.
Figure 6:
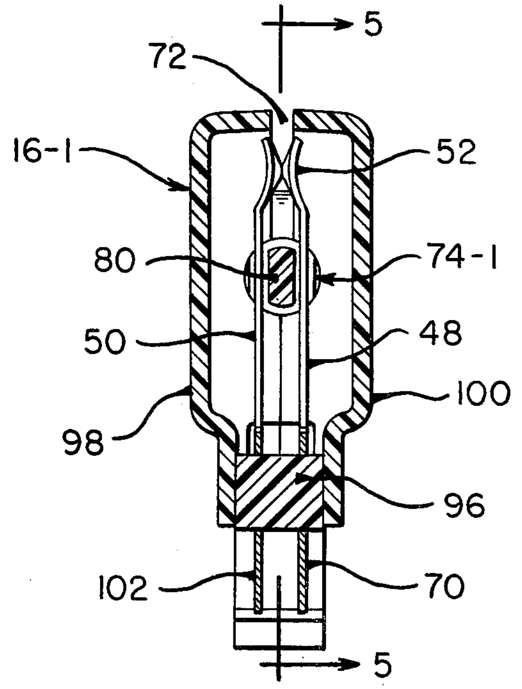
FIG. 6 is a cross-sectional view of the plug-in module shown in FIG. 5 and is taken along the line 6—6 thereof.

FIGS. 5 and 6 show another embodiment of a plug-in module which is designated generally as 16-1 and which is substantially the same as the module 16 shown in FIGS. 1, 2 and 4; however certain features have been changed to facilitate a more economical manufacture thereof. For example, the leaf-type conductors 48, 50 may be conventionally molded into a block 96, as shown in FIGS. 5 and 6. The housing for the module 16-1 is made of identical housing halves 98, 100 from the plastic materials mentioned earlier herein. The lever means 74-1, shown in FIG. 5, substantially is the same as lever means 74 shown in FIG. 1, for example; however, it has a lever 86 formed on each end thereof, and it has fewer disc type guides 78 located between the flat portion 80 thereof. After the lever means 74-1 is mounted between the leaf-type conductors 48, 50, it is mounted in suitable, arcuately-shaped recesses in the housing halves 98, 100, and these housing halves 98, 100 are adhesively or ultra-sonically bonded to opposed sides of the block 96 as shown in FIG. 6. The block 96 has clamp-type flanges 102, 104 (FIGS. 5, 7) joined to the block 96 via integrally formed hinge portions 106, 108 respectively. The clamp-type flanges 102, 104 coact with shoulders 107 formed on opposed sides of a second embodiment of the housing which is designated as 12-1, to detachably secure the module 16-1 to the housing 12-1. The housing 12-1 is substantially the same as housing 12 except for the portions shown in FIGS. 5 and 7.

FIG. 5 also shows additional details of the ends 70 of the leaf-type conductors 48, 50. As previously mentioned, the ends 70 are shaped to form an interference fit with the associated bus conductors 20, 22, 30, etc. For example, if the nominal diameter of the bus conductors, like 20, 22, is 0.101 inch, the nominal diameter of the arcuately shaped portion 110 (FIG. 5) of the ends 70 is 0.091 inch, leaving an interference fit of about 0.005 inch on opposed sides of the associated bus conductor like 20, 22. Because the ends 70 have a slot 112 therein, about 0.003 inch of the interference fit is used in displacing or tensioning opposed sides of the arcuately shaped portion 110, and about 0.002 inch of metal is displaced from the opposed sides of the bus conductors like 20, 22. When the metal is so displaced, the arcuately shaped portion 110 of the end 70 contacts the opposed sides of a bus conductor like 20, 20 to seal the connection therebetween from exposure to air to thereby form a good, solderless, electrical connection therebetween.

Another important feature of this invention is that when a circuit board 20 is inserted in the slot 72 in the module 16-1 for example, if it is not exactly centered therein, it will put increased pressure on either of the leaf-type conductors 48 or 50 depending upon which side of the module 16-1 the circuit board 20 is situated. This increased pressure on leaf-type conductors 48, 50 provides for a good electrical contact, which is necessary when using tin-to-tin contacts as contrasted with the more expensive gold-to-gold contacts for forming electrical connections. The ends 52 of the leaf-type contacts 48, 50 are also shaped as shown in FIGS. 5 and 6 to facilitate the insertion of circuit boards 20 from either the front or side as previously explained. Also, when the module 16-1 is used, the associated circuit board 20 would be provided with two appropriately spaced slots, like 94 (FIG. 2) to accommodate the two levers 86 shown in FIG. 5.

What is claimed is:

1. An electric distributing apparatus comprising:
- a housing having a plurality of conductors therein;
- a module for providing an electrical connection between selected ones of said conductors and a circuit member having electrical contacts thereon;
- means for securing said module to said housing;
- said module having an opening therein to receive said circuit member and comprising:
- conductor means having first and second ends, said first ends forming an electrical connection with selected ones of said conductors when said module is secured to said housing; said second ends contacting said electrical contacts on said circuit member to form an electrical connection therebetween when said circuit member is operatively inserted in said opening in said module;
- said module having means thereon to move said second ends of said conductor means out of contact with said electrical contacts on said circuit member to enable said circuit member to be inserted or removed from said opening in said module;
- said conductors being made of a conductive metal and said first ends of said conductor means being shaped to form an interference fit with the associated said conductors to thereby cut into the surfaces of said conductors when forming said electrical connection therewith;
- said conductors having first portions thereof positioned in spaced parallel relationship in said housing and also having second portions integrally formed with the associated said first portions and which said second portions extend out of said housing for a direct connection to a power source means; and
- said first portions of said conductors having predetermined varying lengths so as to afford a selection of said conductors to which said first ends of said conductor means are connected when said module is secured to said housing;
- said conductor means being positioned in said module so as to be perpendicular to said first portions of said conductors when said module is secured to said housing.

2. An electric power distributing apparatus comprising:
- a housing having spaced parallel bus conductors therein;
- a plug-in module for providing an electrical connection between selected ones of said spaced parallel bus conductors and a circuit board having electrical contacts thereon;
- said plug-in module having an opening therein to receive said circuit board and comprising:
- means for detachably securing said plug-in module to said housing, and
- conductor means mounted in spaced relationship in said module with each said conductor means having first and second ends;
- said first ends of said conductor means being shaped to detachably engage said spaced parallel bus conductors when said plug-in module is attached to said housing to form an electrical connection therebetween;
- means for moving said second ends of said conductor means between first and second positions, in which said first position said second ends are displaced from said opening to enable said circuit board to be inserted or removed from said plug-in module and in which said second position said second ends contact said electrical contacts on said circuit board to form an electrical connection therebetween;

said housing having a length with said bus conductors being parallel to said length and with said bus conductors having predetermined varying lengths so as to afford a selection of said bus conductors to which said conductor means may be connected when said plug-in module is secured to said housing;

said parallel bus conductors being circular in cross section and said first ends of said conductor means being shaped to form an interference fit with the associated said bus conductors to thereby cut into the surface of said bus conductors when forming said electrical connection therewith; and said housing having ridges therein along said length thereof and said first ends of said conductor means extending from one side of said plug-in module to coact with said ridges to assist said securing means in detachably securing said plug-in module along the length of said housing.

3. The apparatus as claimed in claim 2 in which said bus conductors have portions thereof which extend out of said housing and are integrally formed with said bus conductors located within said housing to provide a direct connection to a power source means.

4. The apparatus as claimed in claim 3 in which each said conductor means is comprised of a pair of leaf-type conductors having said first and second ends and said moving means includes a cam means for displacing said second ends of said pair of leaf-type conductors from each other.

5. The apparatus as claimed in claim 3 further comprising at least one said circuit board having a slot in one side thereof, and said moving means comprising a lever means which coacts with said slot in said circuit board to lock said circuit board in said plug-in module to prevent its removal therefrom when said second ends of said conductor means are in said second position.

* * * * *